United States Patent
Basedahl et al.

(10) Patent No.: US 10,484,897 B2
(45) Date of Patent: Nov. 19, 2019

(54) WIDEBAND RADIO COMMUNICATION TEST APPARATUS

(71) Applicant: Rohde & Schwarz GmbH & Co. KG, München (DE)

(72) Inventors: Juergen Basedahl, München (DE); Vesna Zivkovic, München (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 98 days.

(21) Appl. No.: 15/603,694

(22) Filed: May 24, 2017

(65) Prior Publication Data
US 2018/0343574 A1   Nov. 29, 2018

(51) Int. Cl.
*H04W 24/06* (2009.01)
*G06F 11/263* (2006.01)
*H04W 88/02* (2009.01)
*H04W 88/08* (2009.01)

(52) U.S. Cl.
CPC ............ *H04W 24/06* (2013.01); *H04W 88/02* (2013.01); *H04W 88/08* (2013.01)

(58) Field of Classification Search
CPC .............................. H04W 24/06; H04W 24/08
See application file for complete search history.

(56) References Cited

U.S. PATENT DOCUMENTS

| | | | |
|---|---|---|---|
| 7,313,402 B1* | 12/2007 | Rahman | H04W 24/06 455/456.1 |
| 7,424,444 B1* | 9/2008 | Condon | G06Q 10/06 705/26.5 |
| 2004/0003068 A1 | 1/2004 | Boldman et al. | |
| 2005/0096864 A1 | 5/2005 | Bonilla | |
| 2013/0007522 A1* | 1/2013 | Kurapati | G06F 11/3664 714/32 |
| 2014/0129173 A1* | 5/2014 | Kit | G06F 11/263 702/123 |
| 2014/0211021 A1* | 7/2014 | Roh | G06K 9/68 348/187 |
| 2015/0264590 A1* | 9/2015 | Michl | H04W 24/06 455/67.14 |
| 2015/0264591 A1* | 9/2015 | Baeder | H04W 24/08 370/252 |
| 2016/0044520 A1* | 2/2016 | Iyer | H04W 24/08 370/252 |
| 2017/0017795 A1* | 1/2017 | DiGiambattista | G06F 21/577 |
| 2017/0324617 A1* | 11/2017 | Prasad | H04W 24/06 |
| 2018/0123938 A1* | 5/2018 | Desai | H04L 43/50 |

OTHER PUBLICATIONS

Extended European Search Report for European Patent Application No. 17197784.6, dated May 8, 2018, 11 pages.

* cited by examiner

*Primary Examiner* — Scott M Sciacca
(74) *Attorney, Agent, or Firm* — Westman, Champlin & Koehler, P.A.

(57) ABSTRACT

A test apparatus comprising functional entities, FEs, which are assigned to a selected test case, TC, of a test case pool, TCP, by shifting a test case item, TCI, representing the selected test case, TC, to functional block items, FBIs, representing functional entities, FEs.

9 Claims, 7 Drawing Sheets

WIDEBAND RADIO COMMUNICATION TEST APPARATUS

TECHNICAL FIELD

The invention relates to a method and apparatus for testing devices, in particular user equipment devices.

TECHNICAL BACKGROUND

Test devices and test use cases for testing user equipment devices such as smartphones, IoT components or base station devices, become more and more complex. A test apparatus for testing user equipment devices comprises limited resources for performing the required test procedures. A test apparatus may be able to run several test applications concurrently. However, when a user selects an additional test case, the hardware and/or software resources of the test apparatus may not be sufficient to support the additional test case because the resources of the test apparatus have already been assigned to other test cases.

Accordingly, there is a need to provide a method and apparatus which avoid resource conflicts between test cases selected by a user.

SUMMARY OF THE INVENTION

The invention provides according to a first aspect of the present invention a test apparatus comprising functional entities which are assigned to a selected test case of a test case pool by shifting a test case item representing the selected test case to functional block items representing functional entities.

In a possible embodiment of the test apparatus according to the first aspect of the present invention, the test apparatus comprises a processing unit adapted to compare the test capability required by the selected test case as indicated by its associated test case item with the test capabilities offered by the functional entities assigned to the selected test case as indicated by the functional block item of the assigned functional entities.

In a further possible embodiment of the test apparatus according to the first aspect of the present invention, if the test capabilities offered by the functional entities assigned to the selected test case match the test capabilities required by the selected test case a test procedure using the assigned functional entities for the test case is initiated in response to an input command if no further test cases are selected from the test case pool.

In a further possible embodiment of the test apparatus according to the first aspect of the present invention, the functional entities of the test apparatus comprise hardware entities and/or software entities represented by associated functional block items displayed on a graphical user interface of the test apparatus.

In a further possible embodiment of the test apparatus according to the first aspect of the present invention, the functional entities of the test apparatus are controlled by a controller of the test apparatus.

In a still further possible embodiment of the test apparatus according to the first aspect of the present invention, the functional entities of the test apparatus represented by associated functional block items displayed on a graphical user interface of the test apparatus are connectable by said controller of the test apparatus in response to commands received via the graphical user interface.

In a further possible embodiment of the test apparatus according to the first aspect of the present invention, the functional entities of the test apparatus are assigned to a selected test case by dragging a test case item representing the selected test case to functional block items representing the respective functional entities and by dropping the dragged test case item on the functional block items.

In a further possible embodiment of the test apparatus according to the first aspect of the present invention, the test apparatus is adapted to test at least one user equipment device.

In a further possible embodiment of the test apparatus according to the first aspect of the present invention, the functional entities of the test apparatus represented by associated functional block items comprise
an RF Front End,
an AF/IQ/SPDif Front end,
an RF Converter,
a Signaling Unit,
a Measurement Unit,
a Signal Generator,
a Processing Unit,
a Data Application Unit,
an Audio Unit and/or
a Sample Bus.

In a still further possible embodiment of the test apparatus according to the first aspect of the present invention, the test cases of the test case pool comprise
RF conformance test cases,
audio quality test cases,
handover test cases,
end-to-end communication test cases,
coexistence test cases,
user experience test cases, and
emergency service test cases.

The invention further provides according to a second aspect a test apparatus comprising
a controller configured to control functional entities of the test apparatus and configured to control a graphical user interface connected to said test apparatus,
wherein the functional entities are represented by associated functional block items displayed on a display of the graphical user interface and are connectable to each other by the controller according to graphical connections between the associated functional block items input by a user by means of said graphical user interface,
wherein each functional entity of the test apparatus offers specific test capabilities indicated by its associated functional block item,
wherein different test cases of a test case pool are represented by associated test case items displayed on the display of said graphical user interface,
wherein each test case requires specific test capabilities indicated by its associated test case item,
wherein functional entities of the test apparatus are assigned by the user to a selected test case of the test case pool by shifting the displayed test case item representing the selected test case to the displayed functional block items representing the respective functional entities.

The invention further provides according to a third aspect a method for testing devices by means of a test apparatus, wherein functional entities of the test apparatus are assigned to a selected test case of a test case pool by shifting a test case item representing the selected test case to functional block items representing the functional entities.

In a further possible embodiment of the method according to the third aspect of the present invention, the test case is selected from a test case pool by moving a pointer to the displayed test case item representing said test case or by touching the displayed test case item representing said test case.

In a further possible embodiment of the method according to the third aspect of the present invention, the test case item of the selected test case is dragged to functional block items representing functional entities of the test apparatus and dropped on functional block items in order to assign the functional entities of said test apparatus to the selected test case.

In a still further possible embodiment of the method according to the third aspect of the present invention, test capabilities required by the selected test case as indicated by its associated test case item are compared with the test capabilities offered by the functional entities assigned to the selected test case as indicated by the functional block items of the assigned functional entities.

In a further possible embodiment of the method according to the third aspect of the present invention, if the test capabilities offered by the functional entities assigned to the selected test case match the test capabilities required by the selected test case a test procedure using the assigned functional entities for the test case is initiated in response to an input command if no further test cases are selected from the test case pool.

The invention further provides according to a fourth aspect a test system comprising a test apparatus having functional entities and a controller configured to control the functional entities and configured to control a graphical user interface of said test apparatus, wherein the functional entities are assigned to a selected test case of a test case pool by shifting a test case item displayed on a display of said graphical user interface and representing the selected test case to functional block items displayed on a display of said graphical user interface and representing the functional entities, wherein the test apparatus of the test system is adapted to test simultaneously a plurality of user equipment devices, in parallel according to a test procedure of the selected test case using the functional entities of the test apparatus assigned to the selected test case.

In a possible embodiment of the test system according to the fourth aspect of the present invention, said test system comprises a mobile radio test apparatus.

The invention further provides according to a fifth aspect a production facility adapted to manufacture a plurality of user equipment devices comprising at least one test system according to the fourth aspect of the present invention.

In a possible embodiment of the production facility according to the fifth aspect of the present invention, the user equipment devices comprise smartphones, tablet devices, gadgets, IoT components and/or base station devices.

DETAILED DESCRIPTION OF EMBODIMENTS

Figure 1:
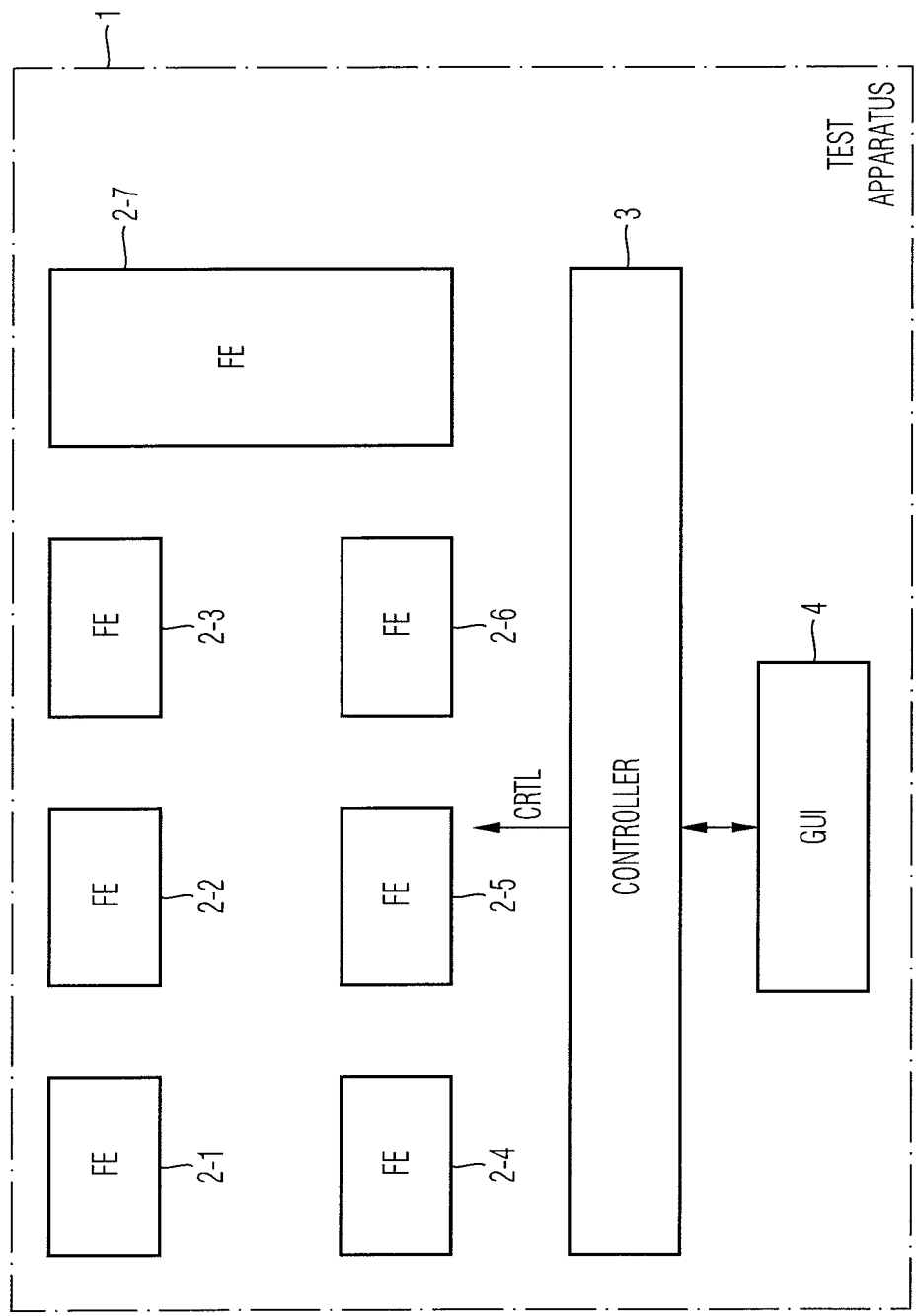
FIG. 1 shows a schematic block diagram of a test apparatus according to the first aspect of the present invention.

FIG. 1 shows an exemplary schematic block diagram of a test apparatus 1 according to an aspect of the present invention. The test apparatus 1 comprises in the illustrated embodiment functional entities which can be assigned to a test case TC of a test case pool TCP. The functional entities comprise different hardware entities and/or software entities of the test apparatus 1. The test apparatus 1 can comprise a plurality of different functional entities including hardware and/or software functional entities. FIG. 1 shows schematically only several functional entities 2-1 to 2-7. The functional entities of the test apparatus 1 can comprise for instance an RF front end. In the embodiment shown in FIG. 1, for instance functional entity 2-7 can comprise an RF front end. The functional entities 2-$i$ can comprise RF connectors. Further, the functional entities can comprise for instance an AF/IQ/SPDif front end. The functional entities 2-$i$ can also comprise RF converters for a specific TX/RX bandwidth. Further, the functional entities 2-$i$ can comprise signaling units. The signaling units can also include signaling units of base stations or user equipment devices. The signaling units can also comprise emulators or fading units. The functional entities 2-$i$ of the test apparatus 1 can also be formed by measurement units such as power meters, modulation analyzing units or spectrum analyzing units. Moreover, the test apparatus 1 can comprise functional entities 2-$i$ including signal generation units adapted to generate signals of arbitrary waveforms. The test apparatus 1 can also comprise as functional entities 2-$i$ processing units such as CPUs, microprocessors or FPGAs. The test apparatus 1 can further comprise as functional entities 2-$i$ in a possible embodiment data application units such as payload data generators. The functional entities of the test apparatus 1 can further comprise audio units such as an AF generator, an AF analyzer or a speech Codec. A further example of a functional entity is a sample bus, for instance an IQ M/N switch matrix. Accordingly, the test apparatus 1 can comprise a plurality of different functional entities 2-$i$ which are adapted to perform different functions within a test setup.

The test apparatus 1 as illustrated in FIG. 1 further comprises a controller 3 adapted to control functional entities 2-$i$ and/or adapted to connect different functional entities 2-$i$ with each other by means of switching entities. The controller 3 of the test apparatus 1 is configured to control functional entities 2-$i$ of the test apparatus 1 and is further configured to control a graphical user interface 4 of the test apparatus 1 as shown in FIG. 1. The graphical user interface 4 can form part of the test apparatus 1 as illustrated in the embodiment of FIG. 1 or can be connected to the test apparatus 1.

The functional entities 2-$i$ can be assigned to a selected test case TC of a test case pool TCP by shifting a test case item TCI representing the selected test case TC to functional block items FBIs representing the respective functional entities 2-$i$.

Shifting the text case item, TCI includes any kind of movement or transfer of the TCI from one place or position to another.

Figure 2:
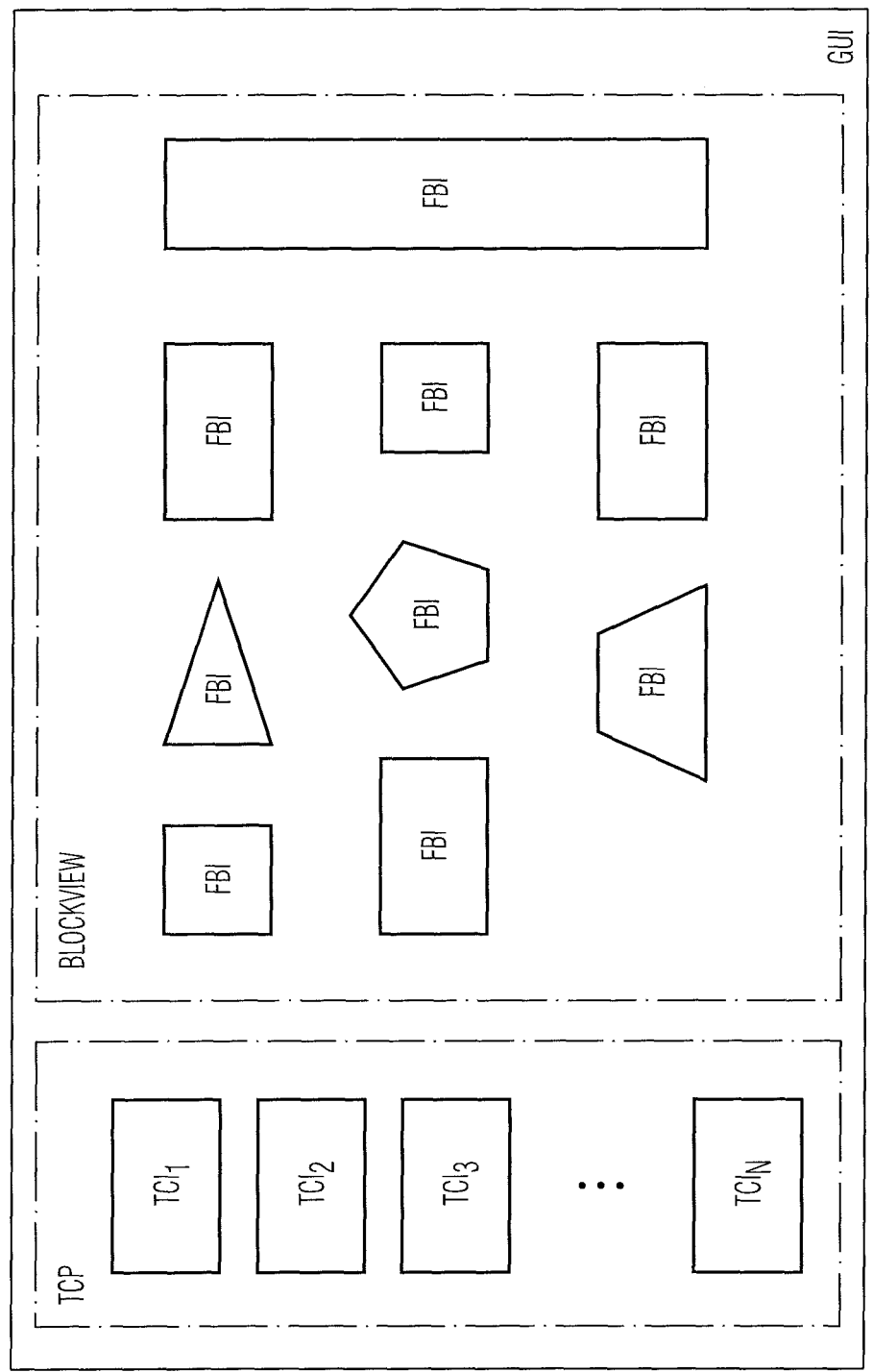
FIG. 2 shows schematically an exemplary embodiment of a graphical user interface of a test apparatus according to the first aspect of the present invention.

FIG. 2 shows schematically a display of a graphical user interface 4 of a test apparatus 1. The display unit of the graphical user interface 4 can be adapted to display a test case pool TCP comprising different test case items TCI each representing a corresponding test case TC. The display unit of the graphical user interface 4 can further display different functional block items FBIs. Each functional block item FBI can represent a corresponding functional entity 2-$i$ of the test apparatus 1 as shown in FIG. 1 or a group of functional entities 2-$i$.

The test cases TCs of the displayed test case pool TCP can comprise different kinds of test cases TCs including RF conformance test cases, audio quality test cases, handover test cases, end-to-end communication test cases, coexistence test cases, user experience test cases and/or emergency service test cases. Each test case item TCI of the test case pool TCP can represent a corresponding test case TC. A test case TC can comprise a conformance test case where it can be tested whether a user equipment device complies with a predetermined wireless communication standard. A test case TC can also comprise an audio quality test case for testing for instance a user experience of a user of a user equipment device. Further, the test case TC can comprise a handover test case for testing a handover of a wireless communication device between cells of a cellular wireless network. Moreover, the test case TC can comprise an end-to-end communication test for testing user experience including voice, video or IP data transfer between user equipment devices. A test case TC can further comprise a coexistence test case testing the coexistence of different devices under test. Further, the test cases TCs can comprise any kind of user experience test cases and/or emergency service test cases. More examples for possible test cases TCs comprise protocol test cases or battery lifetime test cases for testing the lifetime of a battery of a device under test.

A user can select a test case TC by selecting its associated test case item TCI and can then shift the test case item of the selected test case TC to functional block items FBIs representing different functional entities 2-$i$ of the test apparatus 1. The test apparatus 1 comprises in a possible embodiment a processing unit such as a controller 3 illustrated in FIG. 1 which is adapted to compare the test capability required by the selected test case TC as indicated by its associated test case item TCI with the test capabilities offered by the functional entities 2-$i$ assigned to the selected test case TC as indicated by the functional block items FBIs of the assigned functional entities 2-$i$. If the test capabilities offered by the functional entities 2-$i$ assigned to the selected test case TC do match the test capabilities required by the selected test case TC a test procedure using the assigned functional entities 2-$i$ for the test case TC is initiated in response to an input command if no further test cases TCs are selected from the displayed test case pool TCP. The functional entities 2-$i$ of the test apparatus 1 represented by the associated functional block items FBIs displayed on the graphical user interface GUI 4 of the test apparatus 1 are connected in a possible embodiment by the controller 3 of the test apparatus 1 automatically in response to commands received via the graphical user interface GUI 4. The functional entities 2-$i$ of the test apparatus 1 are assigned to the selected test case TC by dragging the test case item TCI representing the selected test case TC to the functional block items FBIs representing the respective functional entities 2-$i$ and by dropping the dragged test case item TCI on the functional block items FBIs. The test apparatus 1 as illustrated in FIG. 1 comprising a displayed graphical user interface as illustrated in FIG. 2 is adapted in a possible embodiment to test one or several equipment devices. These equipment devices can comprise for instance smartphone devices, tablet devices, gadgets, IoT components and/or base station devices. The equipment devices are either connected by a cable or over the air (OTA) to the test apparatus 1. The equipment device form devices under test DUT which are tested by the test apparatus 1. In a possible embodiment, the test apparatus 1 is adapted to test several user equipment devices or other equipment devices such as base station devices simultaneously.

The graphical functionality assignment of resources using the graphical user interface 4 of the test apparatus 1 allows the user or a test person to assign functional entities 2-$i$ such as a hardware component of the test apparatus 1 to a test case TC. This can be performed in a possible embodiment by drag and drop using a pointer. In an alternative embodiment, the displayed test case item TCI can also be touched by the user to select the associated test case TC. In a still further possible embodiment, the selection and shifting of the test case item TCI can be performed in response to move gestures of the user sensed by a sensor of the test apparatus 1. The functional block item FBI representing a functional entity 2-$i$ can represent a hardware item, for example a connector, or a more complex hardware component such as a signaling unit consisting of several physical functional parts. More complex functional block items FBIs can be grouped in a possible embodiment in an application pool separated from simple hardware items on a board.

Figure 3:
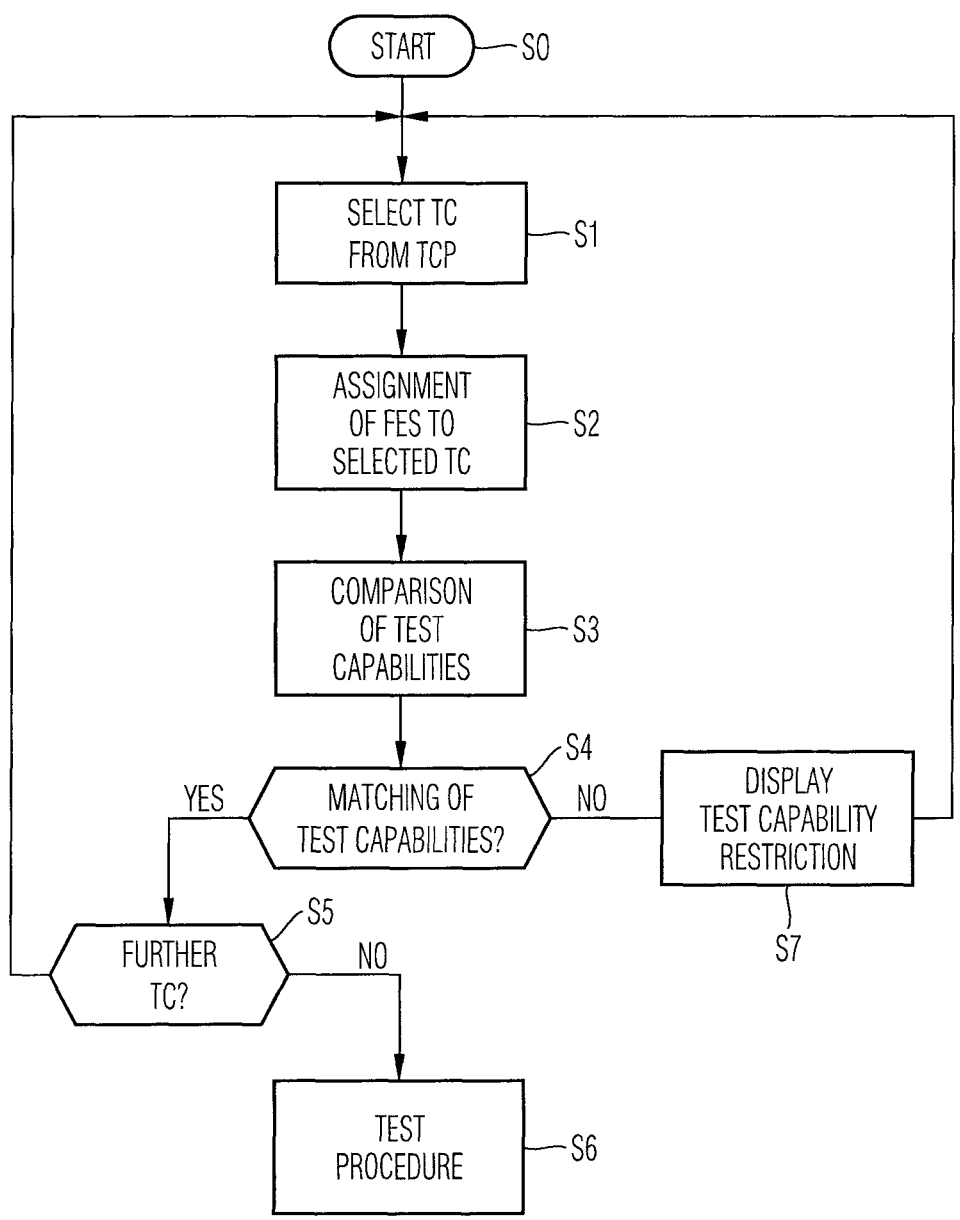
FIG. 3 shows a simple flowchart of an exemplary embodiment of a method for testing devices according to a further aspect of the present invention.

FIG. 3 shows a flowchart of a possible exemplary embodiment of a method for testing devices, in particular user equipment devices by means of a test apparatus 1. After having initiated the procedure in step S0, the user selects a test case TC from a displayed test case pool TCP in step S1. For instance, a user may touch a test case item TCI within the displayed test case pool TCP as illustrated in FIG. 2. In an alternative embodiment, the user may select the test case TC from the test case pool TCP by moving a mouse to the test case item TCI and by clicking on the displayed test case item TCI.

In a further step S2, the functional entities 2-$i$ of the test apparatus 1 are assigned to the selected test case TC. In a possible embodiment, the test case item TCI of the selected test case TC is dragged to functional block items FBIs representing functional entities 2-$i$ of the test apparatus 1 and dropped on the functional block items FBIs in order to assign the associated functional entities 2-$i$ of the test apparatus 1 to the selected test case TC.

In a further step S3, a comparison of test capabilities is performed. The test capabilities required by the selected test case TC as indicated by its associated test case item TCI are compared automatically with the test capabilities offered by the functional entities 2-$i$ assigned to the selected test case TC as indicated by the functional block items of the assigned functional entities 2-$i$.

In a further step S4, it is evaluated whether the test capabilities do match each other. If the test capabilities offered by the functional entities 2-$i$ of the test apparatus 1 assigned to the selected test case TC match the test capabilities required by the selected test case TC it is checked in step S5 whether a further test case TC is selected from the test case pool TCP by the user. If the user does not select any further test case a test procedure is initiated in step S6 using the assigned functional entities 2-$i$ of the test apparatus 1 for a test case TC selected in step S1 from the test case pool TCP.

If there is no matching of test capabilities determined in step S4 the user can be informed that the test capabilities of the test apparatus 1 are not sufficient for the selected test case and the user may select another test case TC in step S1. The user may further deactivate an already running test case procedure to get more available resources within the test apparatus 1 for the new test case TC.

Figure 4:
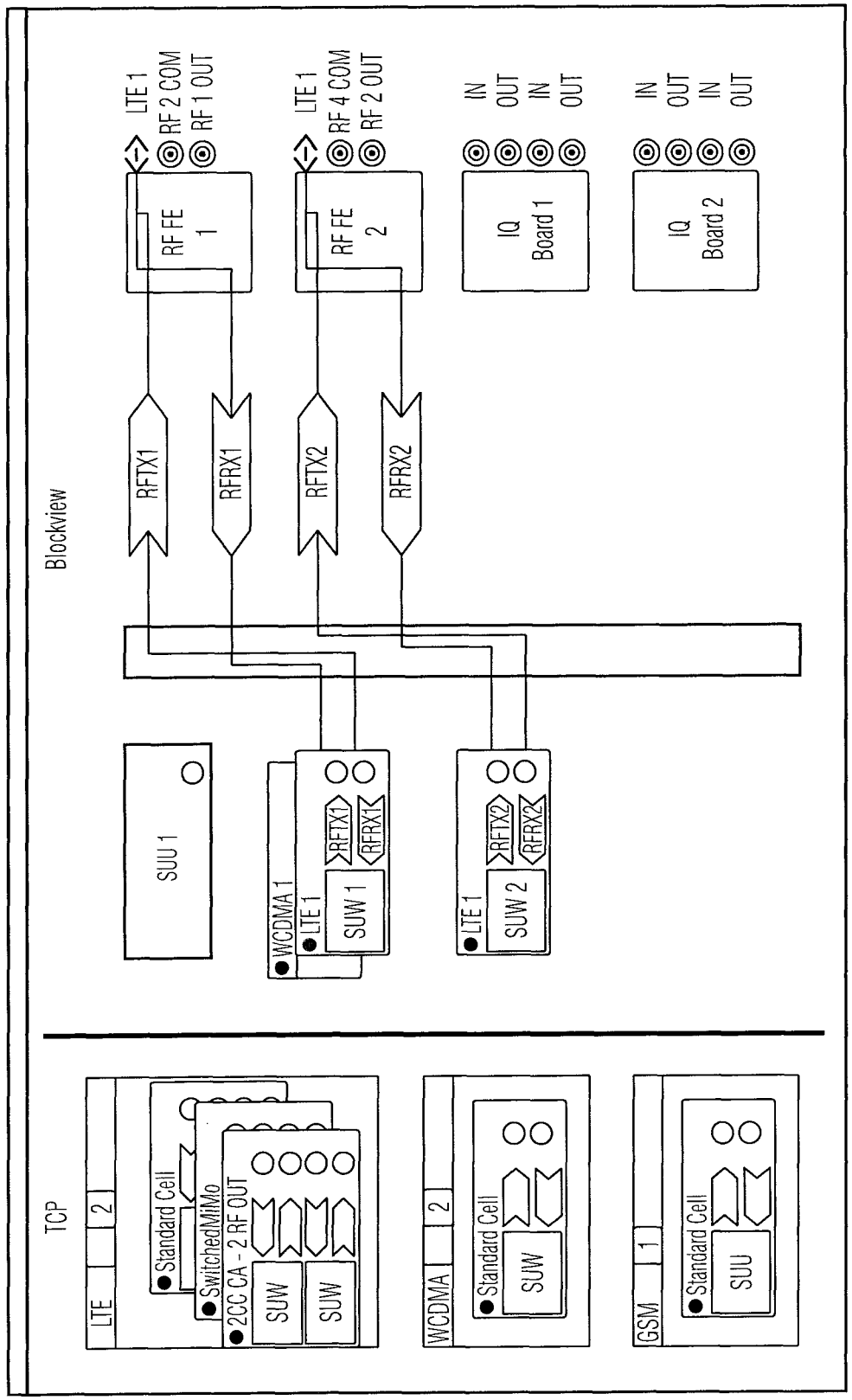
FIG. 4 shows schematically an example of a test case pool and functionally block items displayed to a user by means of a graphical user interface of a test apparatus according to the first aspect of the present invention.

FIG. 4 shows a further example of test case items TCIs and functional block items FBIs displayed to a user via a graphical user interface 4 of the test apparatus 1. In this example, items for performing radio access testing are displayed. In a possible embodiment, the test case items TCIs as well as the functional block items FBIs can comprise functionality cards displaying an associated functionality. In a possible embodiment, these functionality cards can comprise required information on hardware and/or software resources as well as settings for dedicated test scenarios. The functionality is assigned then to the test case item TCI of the selected test case TC and is moved to a suitable location on the displayed functional block items FBIs. Potential hardware and/or software conflicts can be indicated by displaying corresponding notifications for the user. Occupied functional entities 2-$i$ such as hardware parts can be reassigned by replacing the occupying test case item TCI of a test case TC with another suitable test case item TCI of another test case TC.

The removal of a test case item TCI, i.e. when terminating a specific test scenario, can be done by dragging the test case item TCI outside the region of the display where the functional block items FBIs are displayed to the user.

The test case items TCIs can differentiate to allow a user of the test apparatus 1 to distinguish between related test functionalities. Further, information about a performance state of the test case item TCI can be provided for instance by different colors of the test case item TCI for each state. In a possible embodiment, additional routing lines RL displayed on the graphical user interface 4 can indicate a signal path and relevant functional entities 2-$i$ such as hardware components within the test apparatus 1.

Figure 5A:
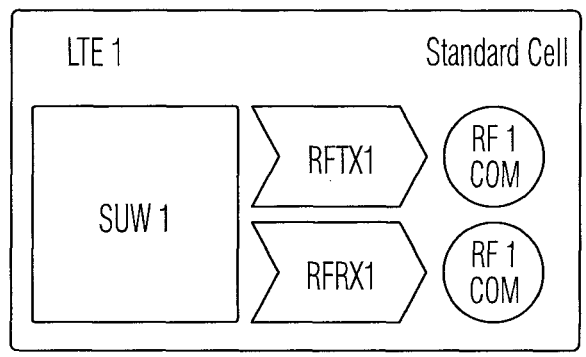
FIGS. 5A, 5B show exemplary functional block items displayed to a user via a graphical user interface.
Figure 5B:
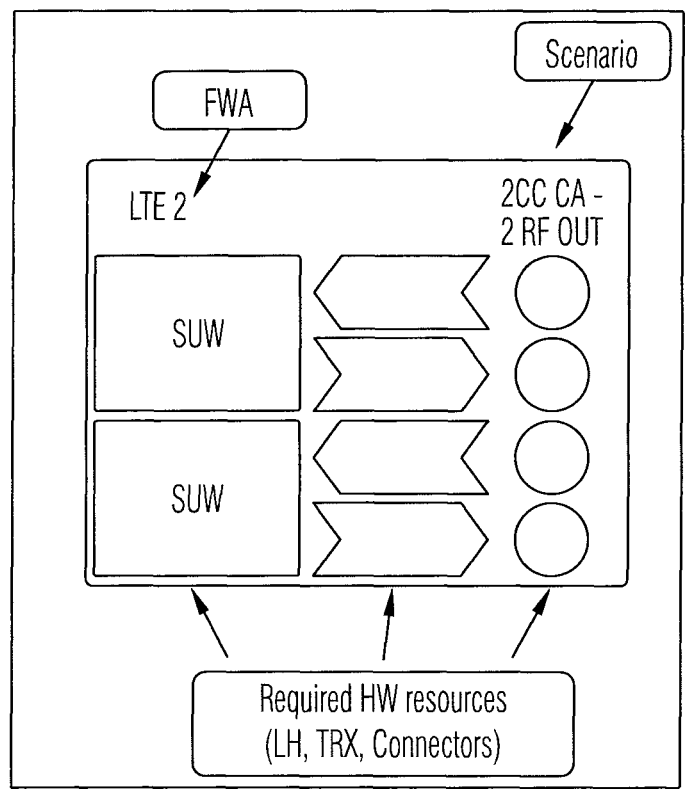

FIGS. 5A, 5B illustrate examples of test case items TCIs which can be displayed on a graphical user interface 4 of the test apparatus 1 according to the present invention. The test case items TCIs can visualize needed resources and indicate its complexity. They can indicate the FWA, the scenario and the required hardware resources.

Figure 6:
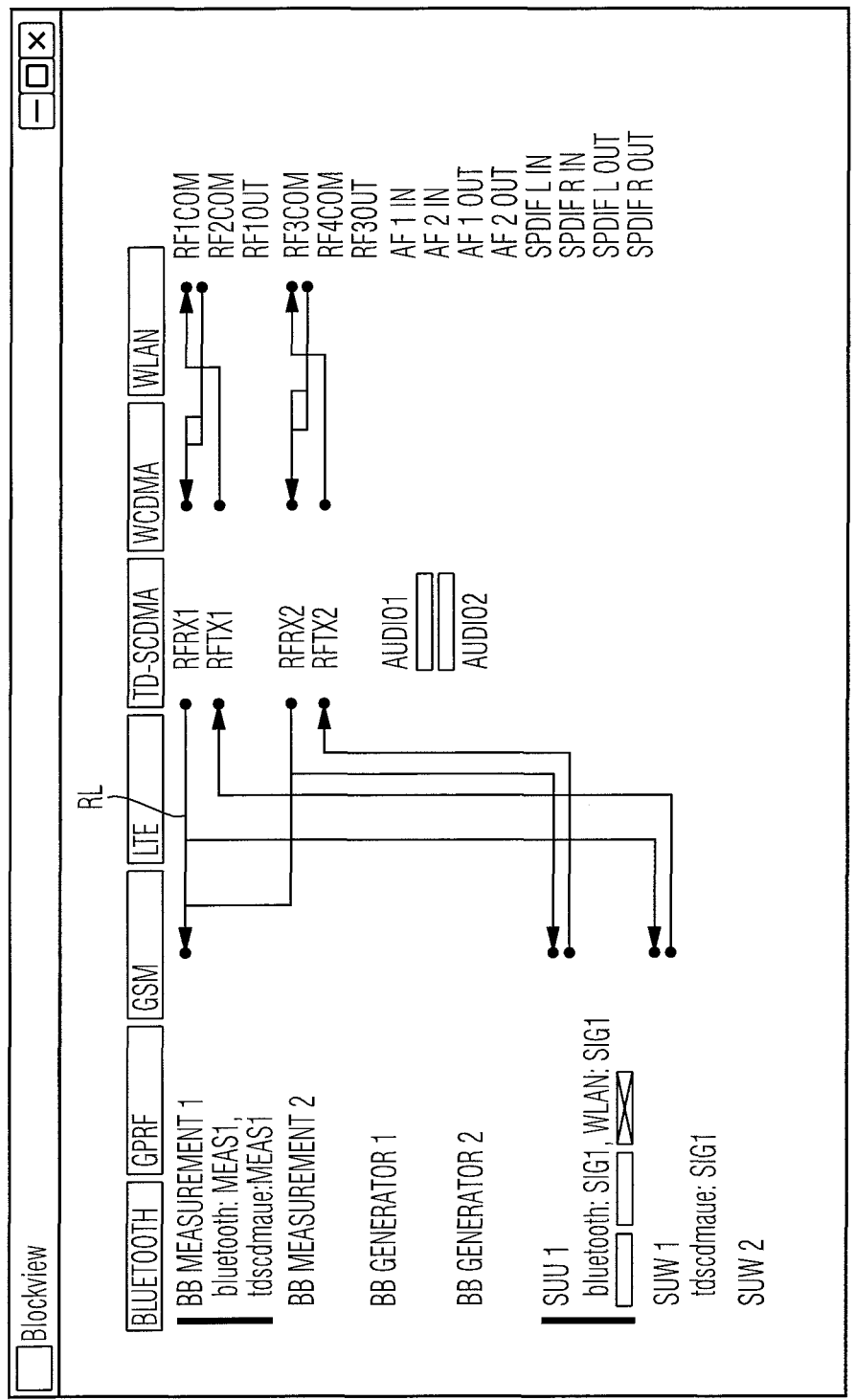
FIG. 6 shows a further example of functional block items displayed to a user via a graphical user interface.

FIG. 6 shows a further example of displayed functional block items FBIs connected to each other via routing lines RL.

The test apparatus 1 according to the present invention comprising a graphical user interface 4 allows graphical functionality assignment. When a user such as a test person intends to perform a specific test case TC the user can browse in a possible embodiment a list of all available test cases TCs in the graphical user interface 4 of the test apparatus 1 by browsing the displayed test case items TCIs. The user may find the required test case TC in the list of test case items TCIs of the test case pool TCP. The test case item TCI may indicate whether the associated test case TC is selectable or suspended. The required hardware and/or software resources may be visualized graphically on the respective test case item TCI. Missing hardware and/or software resources may be displayed to get the corresponding test case TC working. It may be also possible that the user cannot find a test case item TCI associated to the required test case TC. This may happen if the test case TC required by the user is not supported by the test apparatus 1.

In case that the user finds a test case item TCI corresponding to the desired test case TC within the displayed test case pool TCP, he can select a test case TC by clicking on the displayed test case item TCI of the test case TC and drag the test case item TCI to functional block items FBIs representing functional entities 2-$i$ of the test apparatus 1. If the test case item TCI is dragged to free resources of the test apparatus 1 these resources can be assigned to the selected test case TC. However, if the test case item TCI is dragged to already occupied resources of the test apparatus 1 the user can determine in a possible embodiment whether to suppress the current test case TC in process or to cancel the selection operation for the new test case TC.

In a possible embodiment, the controller 3 can perform all necessary actions automatically, in particular resource allocation, path routing, loading and start of firmware application as well as linkage between firmware applications.

If the user intends to perform a second test case concurrent to a previous already running test case TC the user may browse the displayed list of test case items TCIs to select the additional test case TC from the test case pool TCP. In a possible embodiment, the test device can guide the user whether a second test case TC does fit to the remaining test capabilities of the test apparatus or not. If the remaining capabilities of the instrument, i.e. test apparatus 1, are sufficient the user can drag and drop the test case item TCI of the second test case TC to the free resources or functional entities 2-$i$ of the test apparatus 1 represented by the functional block items FBIs displayed on the graphical user interface 4 of the test apparatus 1. In this way, the user can achieve that two different test cases TCs are performed concurrently by the test apparatus 1.

If the user is informed that the selected second test case TC cannot be performed with the remaining test capabilities of the test apparatus 1 the user can in a possible embodiment drag and drop the test case item TCI of the second test case TC to already occupied resources and reassign the resources to the second test case TC. In this case, the first test case TC is terminated to initiate the second test case TC.

In a possible embodiment, the test apparatus 1 comprises manually operated input instruments such as a mouse allowing drag and drop operations. The drag and drop operation can be used for a test case selection, i.e. for test case activation and/or test case deactivation. Further, a drag and drop operation can be used to move a test case item TCI to desired functional block entities FBIs to change a resource assignment within the test apparatus 1. Further, a drag and drop operation can be used to move routing lines RL to select another signal path. Further, the drag and drop operation can be used to move a connector to change the input and/or output of a device under test DUT.

In a possible embodiment, a right mouse click can be used to activate an application, e.g. start a test case TC functionality. A mouse click can also be used to activate all needed resources and paths and/or to start required actions such as measurement or signaling.

The graphical user interface 4 of the test apparatus 1 is configured to display all relevant information to a user, in particular running test applications, actively used paths and resources of the test apparatus 1, a device under test connector and potential resource conflicts. Accordingly, performing even complex test scenarios is facilitated. Further, the available resources of the test apparatus 1 can be exploited to a maximum by performing different test cases TC concurrently without resource conflicts. The testing is less cumbersome for a user and a change of a test setup can be performed faster.

Figure 7:
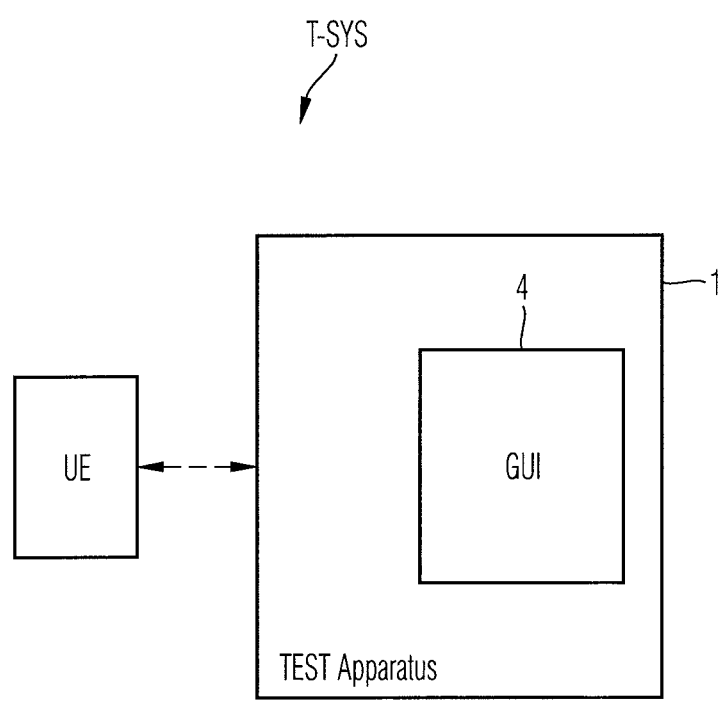
FIG. 7 shows a schematic block diagram for illustrating an exemplary embodiment of a test system according to a further aspect of the present invention.

FIG. 7 shows a block diagram of a test system according to a further aspect comprising at least one test apparatus 1 having a graphical user interface 4. The test apparatus 1 can be used to test one or several devices such as user equipment devices UE simultaneously. The equipment devices can be connected wireless or via a cable. The test apparatus 1 comprises integrated functional entities 2-i and a controller 3 configured to control the functional entities 2-i and to control the graphical user interface 4. The functional entities 2-i integrated in the test apparatus 1 comprising hardware entities and/or software components can be selected to a selected test case TC of a displayed test case pool TCP by shifting a test case item TCI displayed on a display of the graphical user interface 4 and representing the selected test case TC to functional block items FBIs displayed on the display of the graphical user interface 4 and representing the functional entities 2-i of the test apparatus 1. The test apparatus 1 of the test system is adapted to test simultaneously a plurality of equipment devices, in particular user equipment devices UE, in parallel according to a test procedure of the selected test case TC using the functional entities 2-i of the test apparatus 1 assigned to the selected test case TC. The test apparatus 1 can comprise in a possible embodiment a mobile radio test apparatus.

The test system illustrated in FIG. 7 can be used in a production facility which is adapted to manufacture a plurality of equipment devices. The equipment devices can comprise different devices including smartphone devices, tablet devices, gadget devices, IoT components and/or base station devices. The test apparatus 1 can be used for performing tests in a laboratory but also for performing production line testing. The test apparatus 1 can be used for a wide range of different test cases TC including testing of audio and/or video performance, battery lifetime testing, conformance testing, handover testing, end-to-end communication testing or coexistence test cases. The test apparatus 1 can be used for testing user equipment devices and/or base station devices of cellular networks. In a further possible embodiment, the testing of the equipment devices can be performed in the field by a mobile test apparatus 1. The test apparatus 1 can perform coexistence test cases ensuring standard compliant operation and minimal mutual interference of user equipment devices. In a possible embodiment, the test apparatus 1 is adapted to emulate base station functions and/or access point functions. The test apparatus 1 can be adapted to support different protocol stacks. The test apparatus 1 can also be used to perform protocol conformance test scenarios. Further, the test apparatus 1 can be adapted to perform RF conformance test cases. In a possible embodiment, a user is able to initiate test procedures via the graphical user interface 4 without any additional programming or code compilation. Test creation, test parameterization, test execution as well as test analysis can be performed under control of the controller 3 of the test apparatus 1 under the supervision of a user using the graphical user interface 4 of the test apparatus 1. The number of test cases TCs supported by the test apparatus 1 can vary. Each test case TC can be represented by a corresponding test case item TCI. In a possible embodiment, a plurality of test cases TCs can be loaded from a database via an interface of the test apparatus 1. Each test case TC can be associated with a corresponding test case item TCI. In a possible embodiment, the user has the possibility to generate a test case TC and to create a corresponding test case item TCI which can be stored in the database of the system and/or in a local memory of the test apparatus 1. The intuitive graphical user interface 4 makes it simple for a user of the test apparatus 1 to test equipment devices for compliance with different protocols for various technologies such as Bluetooth, TSM, LTE, WLAN or WCDMA.

The invention claimed is:

1. A test apparatus comprising:
   functional entities, FEs, which are assigned to a selected test case, TC, of a test case pool, TCP, by dragging a test case item, TCI, representing the selected test case, TC, to functional block items, FBIs, representing the respective functional entities, Fes, and by dropping the dragged test case item, TCI, on the functional block items, FBIs; and
   a processing unit adapted to compare test capabilities required by the selected test case, TC, as indicated by its associated test case item, TCI, with test capabilities offered by the functional entities, FEs, assigned to the selected test case, TC, as indicated by the functional block items, FBIs, of the assigned functional entities, FEs;
   wherein, if the test capabilities offered by the functional entities, FEs, assigned to the selected test case, TC, match the test capabilities required by the selected test case, TC, a test procedure using the assigned functional entities, FEs, for the test case, TC, is initiated in response to an input command if no further test cases, TCs, are selected from the test case pool, TCP; and
   wherein, if there is no matching of test capabilities, the user is informed that the test capabilities of the test apparatus are not sufficient for the selected test case, TC, and an already running test case procedure is deactivated to get more available resources within the test apparatus for the selected test case, TC, based on a drag and drop operation of the user for test case deactivation.

2. The test apparatus according to claim 1 wherein the functional entities, FEs, of said test apparatus comprise hardware entities and/or software entities represented by associated functional block items, FBIs, displayed on a graphical user interface, GUI, of said test apparatus.

3. The test apparatus according to claim 1 wherein the functional entities, FEs, of said test apparatus are controlled by a controller of said test apparatus.

4. The test apparatus according to claim 3 wherein the functional entities, FEs, of said test apparatus represented by associated functional block items, FBIs, displayed on a graphical user interface, GUI, of said test apparatus are connectable by said controller of said test apparatus in response to commands received via the graphical user interface, GUI.

5. The test apparatus according to claim 1 wherein the test apparatus is adapted to test at least one user equipment, UE, device.

6. The test apparatus according to claim 1 wherein the functional entities, FEs, of said test apparatus represented by associated functional block items, FBIs, comprise
   an RF Front End,
   an AF/IQ/SPDif Front end,
   an RF Converter,
   a Signaling Unit,
   a Measurement Unit,
   a Signal Generator,
   a Processing Unit,
   a Data Application Unit,
   an Audio Unit and/or
   a Sample Bus.

7. The test apparatus according to claim 1 wherein the test cases, TCs, of said test case pool, TCP, comprise
- RF conformance test cases,
- audio quality test cases,
- handover test cases,
- end-to-end communication test cases,
- coexistence test cases,
- user experience test cases, and
- emergency service test cases.

8. A method for testing devices by means of a test apparatus,
- wherein functional entities, FEs, of said test apparatus are assigned to a selected test case, TC, of a test case pool, TCP, by dragging a test case item, TCI, representing the selected test case, TC, to functional block items, FBIs, representing the functional entities, Fes, and by dropping the dragged test case item, TCI, on the functional block items, FBIs; and
- wherein test capabilities required by the selected test case, TC, as indicated by its associated test case item, TCI, are compared with test capabilities offered by the functional entities, FEs, assigned to the selected test case, TC, as indicated by the functional block items, FBIs, of the assigned functional entities, FEs;
- wherein, if the test capabilities offered by the functional entities, FEs, assigned to the selected test case, TC, match the test capabilities required by the selected test case, TC, a test procedure using the assigned functional entities, FEs, for the test case, TC, is initiated in response to an input command if no further test cases, TCs, are selected from the test case pool, TCP; and
- wherein, if there is no matching of test capabilities, the user is informed that the test capabilities of the test apparatus are not sufficient for the selected test case and an already running test case procedure is deactivated to get more available resources within the test apparatus for the selected test case, based on a drag and drop operation of the user for test case deactivation.

9. The method according to claim 8
wherein the test case, TC, is selected from a test case pool, TCP, by moving a pointer to the displayed test case item, TCI, representing said test case, TC, or by touching the displayed test case item, TCI, representing said test case, TC.

* * * * *